(12) United States Patent
Kando (10) Patent No.: US 7,394,336 B2
(45) Date of Patent: Jul. 1, 2008

(54) ELASTIC BOUNDARY WAVE APPARATUS

(75) Inventor: Hajime Kando, Ritto (JP)

(73) Assignee: Murata Manufacturing Co. Ltd., Kyoto ( * ) Notice: Subject to any disclaimer, the term of this patent is extended or adjusted under 35 U.S.C. 154(b) by 0 days.

(21) Appl. No.: 11/924,873

(22) Filed: Oct. 26, 2007

(65) Prior Publication Data

US 2008/0042781 A1 Feb. 21, 2008

Related U.S. Application Data

(63) Continuation of application No. PCT/JP2006/308597, filed on Apr. 25, 2006.

(30) Foreign Application Priority Data

May 16, 2005 (JP) .............................. 2005-142839

(51) Int. Cl.
  *H03H 9/145* (2006.01)
  *H03H 9/25* (2006.01)
  *H03H 9/64* (2006.01)
(52) U.S. Cl. .................... 333/193; 333/195; 310/313 B
(58) Field of Classification Search ......... 333/193–196; 310/313 R, 313 B, 313 C, 313 D
See application file for complete search history.

(56) References Cited

U.S. PATENT DOCUMENTS

| 7,262,676 B2 * | 8/2007 | Ruile et al. ................. 333/193 |
| 2001/0043024 A1 | 11/2001 | Takamine et al. |
| 2004/0066115 A1 | 4/2004 | Takamine |
| 2004/0124740 A1 | 7/2004 | Takamine et al. |
| 2006/0071579 A1 | 4/2006 | Kando |

FOREIGN PATENT DOCUMENTS

| JP | 58-030217 A1 | 2/1983 |
| JP | 64-005113 A1 | 1/1989 |
| JP | 07-074588 A1 | 3/1995 |
| JP | 07-283688 A1 | 10/1995 |
| JP | 2000-114917 A1 | 4/2000 |
| JP | 2002-111443 A1 | 4/2002 |
| JP | 2002-111444 A1 | 4/2002 |
| JP | 2004-140738 A1 | 5/2004 |
| WO | WO 2004/109913 | * 12/2004 |

OTHER PUBLICATIONS

Official communication issued in the International Application No. PCT/JP2006/308597, mailed on Aug. 1, 2006.

* cited by examiner

*Primary Examiner*—Barbara Summons
(74) *Attorney, Agent, or Firm*—Keating & Bennett, LLP

(57) ABSTRACT

An elastic boundary wave apparatus that is capable of suppressing an undesired response due to a comb-shaped capacitor electrode includes a first medium; a second medium stacked on the first medium; and a plurality of electrodes arranged in the boundary between the first and second media, wherein a filter and/or a resonator, and an electrostatic capacitor that is electrically connected to the filter and/or the resonator are defined by the plurality of electrodes, the filter and/or the resonator each include an IDT electrode, and the electrostatic capacitor is defined by a comb-shaped capacitor electrode. When the period of the electrode fingers of the IDT is denoted as $\lambda m$, the sound velocity of an elastic boundary wave in the IDT is denoted as Vm, the period of the electrode fingers of the comb-shaped capacitor electrode is denoted as $\lambda c$, and the sound velocity of a transverse wave having a lower sound velocity among the sound velocities of the slower transverse waves through the first and second media in the normal direction of the electrode fingers of the comb-shaped capacitor electrode is denoted as Vc, the relationship $$Vm/\lambda m < Vc/\lambda c$$

is satisfied.

7 Claims, 7 Drawing Sheets

ELASTIC BOUNDARY WAVE APPARATUS

BACKGROUND OF THE INVENTION

1. Field of the Invention

The present invention relates to an elastic boundary wave apparatus in which electrodes are arranged between a plurality of media and, more particularly, relates to an elastic boundary wave apparatus in which a circuit includes a filter, a resonator, and an electrostatic capacitor, and the resonator and the electrostatic capacitor are connected to the filter.

2. Description of the Related Art

In elastic boundary wave apparatuses, IDTs (interdigital transducers) are arranged at the interface of different media, and an elastic boundary wave propagates along the above-mentioned interface. Therefore, when compared with an elastic surface wave apparatus, the elastic boundary wave apparatus does not require a complex package, the construction can be simplified, and a low profile can be achieved. An example of this type of elastic boundary wave apparatus has been disclosed in Japanese Unexamined Patent Application Publication No. 58-30217 described below.

In the elastic boundary wave apparatus, also, similarly to the elastic surface wave apparatus, various resonators, filters, or a combined circuit including a resonator and a filter can be constructed by forming various electrodes.

In the elastic surface wave apparatus, when an electrostatic capacitor is connected to a filter, a comb-shaped capacitor electrode having an electrode configuration similar to that of an IDT is often used. In the elastic boundary wave apparatus, also, in order to improve the amount of attenuation in an elastic boundary wave filter, it is considered that the amount of attenuation can be improved by arranging this type of comb-shaped capacitor electrode at the interface and by connecting it to the filter.

A comb-shaped capacitor electrode has a plurality of electrode fingers that interdigitate with each other in the same manner as in an IDT. Therefore, in a comb-shaped capacitor electrode for simply obtaining electrostatic capacitance, when electrical potential is applied between an electrode finger that is to be connected to one of the electrical potentials and an electrode finger that is to be connected to the other electrical potential, the comb-shaped capacitor electrode occasionally work as an elastic boundary wave resonator. That is, in the comb-shaped capacitor electrode, an undesired elastic boundary wave is excited, and there is a risk that the wave appears as an unwanted resonance.

When the comb-shaped capacitor electrode works as an IDT in the manner described above and an undesired resonance occurs, filter characteristics are deteriorated in a filter apparatus using an elastic boundary wave. In particular, in the frequency characteristics of the comb-shaped capacitor electrode, many responses appear in a frequency band higher than a frequency of a main resonance in the comb-shaped capacitor electrode. Therefore, a main resonance by excitation of the comb-shaped capacitor electrode and many responses at high frequencies appear as spurious responses that are not desired in the elastic boundary wave filter apparatus, and filter characteristics are apt to be greatly deteriorated.

SUMMARY OF THE INVENTION

In order to overcome the problems described above, preferred embodiments of the present invention provide an elastic boundary wave apparatus that solves the above-described drawbacks of the related art, in which an electrostatic capacitor defined by a comb-shaped capacitor electrode is connected to a filter, and deterioration of filter characteristics due to an undesired response by excitation of the comb-shaped capacitor electrode is prevented.

According to a preferred embodiment of the present invention, an elastic boundary wave apparatus includes a first medium; a second medium stacked on the first medium; and a plurality of electrodes arranged in a boundary between the first and second media, wherein a filter and/or a resonator, and an electrostatic capacitor that are electrically connected to the filter and/or the resonator are defined by the plurality of electrodes, the filter and/or the resonator each include an IDT electrode, the electrostatic capacitor includes a comb-shaped capacitor electrode, and when the period of the electrode fingers of the IDT is denoted as $\lambda m$, the sound velocity of an elastic boundary wave in the IDT is denoted as $Vm$, the period of electrode fingers of the comb-shaped capacitor electrode is denoted as $\lambda c$, and the sound velocity of a transverse wave having a lower sound velocity among the lower sound velocities of the transverse waves through the first and second media in the normal direction of the electrode fingers of the comb-shaped capacitor electrode is denoted as $Vc$, a relationship $Vm/\lambda m < Vc/\lambda c$ is satisfied.

In a specific preferred embodiment of the present invention, the relationship between the period $\lambda m$ of the electrode fingers of the IDT and the period $\lambda c$ of the electrode fingers of the comb-shaped capacitor electrode is preferably $\lambda c > 0.5 \times \lambda m$.

In another specific preferred embodiment of the present invention, the filter and the resonator are each defined by the plurality of electrodes, the terminals of the filter and the resonator are connected in series to each other, and the comb-shaped capacitor electrodes are connected in parallel to the electrodes that connect the filter and the resonator to each other.

In still another specific preferred embodiment of the present invention, as the filter and the resonator, one pair of a set of a first filter having first and second terminals and a first resonator, and a set of a second filter having first and second terminals and a second resonator are arranged in parallel, the first terminal of the first filter and the first terminal of the second filter are connected to each other, defining an input terminal, the polarity of an electrical signal output from the second terminal of the first filter is inverted with respect to the polarity of an electrical signal output from the second terminal of the second filter, the elastic boundary wave apparatus further including a first connection electrode that connects the second terminal of the first filter in series to the first resonator, and a second connection electrode that connects the second terminal of the second filter in series to the second resonator, wherein the first connection electrode and the second connection electrode are connected in parallel to each other via the comb-shaped capacitor electrode.

In another specific preferred embodiment of the present invention, the comb-shaped capacitor electrodes includes first and second comb-shaped capacitor electrodes that are connected to the first and second filters, respectively, one end of the first comb-shaped capacitor electrode and one end of the second comb-shaped capacitor electrode are commonly connected and are also grounded.

In still another specific preferred embodiment of the present invention, the sound velocity of an elastic boundary wave propagation mode in which a main response of the comb-shaped capacitor electrode is located is higher than the sound velocity of the propagation mode of an elastic boundary wave in the IDT constituting the first resonator and the second resonator.

In still another specific preferred embodiment of the present invention, the length direction of the electrode fingers of the comb-shaped capacitor electrode differs from the length direction of the electrode fingers of the IDT constituting the first resonator and the second resonator.

In the elastic boundary wave apparatus according to various preferred embodiments of the present invention, a first medium and a second medium are stacked, and a plurality of electrodes are arranged in the boundary between the first and second media. At least a filter and/or a resonator, and an electrostatic capacitor are constructed of the plurality of electrodes. The filter and/or the resonator are each constructed of an IDT. The electrostatic capacitor is constructed of a comb-shaped capacitor electrode. As described above, a relationship $Vm/\lambda m < Vc/\lambda c$ is satisfied. As a result, the frequency of an elastic boundary wave excited by the comb-shaped capacitor electrode is separated from the passband and the resonance point of the resonator.

Moreover, when the elastic boundary wave that is excited by the comb-shaped electrode is simply shifted toward high frequencies, the pitch of the electrode fingers of the comb-shaped capacitor electrode becomes too small, and manufacturing is not possible practically. In comparison, in various preferred embodiments of the present invention, since the relationship $Vm/\lambda m < Vc/\lambda c$ is set in the manner described above, the band targeted by the elastic boundary wave apparatus is lower than the frequency at which an elastic boundary wave excited by the comb-shaped capacitor electrode is cut off. Therefore, it is possible to improve filter characteristics and resonance characteristics while the pitch of the electrode fingers of a comb-shaped capacitor electrode is set at a magnitude at which manufacturing is possible.

When the filter and the resonator are constructed of the plurality of electrodes, the terminals of the filter and the resonator are connected in series to each other, and comb-shaped capacitor electrodes are connected in parallel to the electrode that connects the filter to the resonator, with such a circuit configuration, the impedance of the connection section of the filter and the resonator is made inductive in the vicinity of the passband of the filter by using a large electromechanical coupling coefficient of the elastic boundary wave, and a capacitor is connected in parallel to this filter, making it possible to achieve matching of the connection section in the passband. Outside the passband, it is possible to improve the amount of attenuation by deviation from the matching point.

In various preferred embodiments of the present invention, when, as a filter and a resonator, one pair of a set of a first filter and a first resonator, and a set of a second filter and a second resonator are arranged in parallel, the first terminals of the first and second filters are connected to each other, defining an input terminal, and the polarity of an electrical signal output from the second terminal of the first filter is inverted with respect to the polarity of an electrical signal output from the second terminal of the second filter, it is possible to provide an elastic boundary wave apparatus having a balance-to-unbalance conversion function in accordance with the present invention.

When the comb-shaped capacitor electrode includes first and second comb-shaped capacitor electrodes connected to the first and second filters, respectively, and one end of the first comb-shaped capacitor electrode and one end of the second comb-shaped capacitor electrode are connected to each other and are grounded, the degree of balance can be effectively improved.

When the sound velocity of the elastic boundary wave propagation mode in which a main response of the comb-shaped capacitor electrode is located is higher than the sound velocity of the propagation mode of the elastic boundary wave in the IDT constituting the first and second resonators, the response of the elastic boundary wave excited by the comb-shaped capacitor electrode is positioned at higher frequencies than the elastic boundary wave propagates in the filter and the second resonator connected to the filter. Therefore, the response by the elastic boundary wave propagation mode, which is a main response of the comb-shaped capacitor electrode, can be reliably placed outside the band of the filter, and filter characteristics can be improved.

When the length direction of the electrode fingers of the comb-shaped capacitor electrode differs from the length direction of the electrode fingers of the IDT constituting the first and second resonators, even if an elastic boundary wave is excited in the comb-shaped capacitor electrode, reception of the excited elastic boundary wave by the electrode fingers of the IDT constituting the first and second resonators is obstructed, and thereby filter characteristics can be improved further.

Other features, elements, processes, steps, characteristics and advantages of the present invention will become more apparent from the following detailed description of preferred embodiments of the present invention with reference to the attached drawings.

DETAILED DESCRIPTION OF PREFERRED EMBODIMENTS

The present invention will be clarified below by describing specific preferred embodiments of the present invention while referring to the drawings.

Figure 1A:
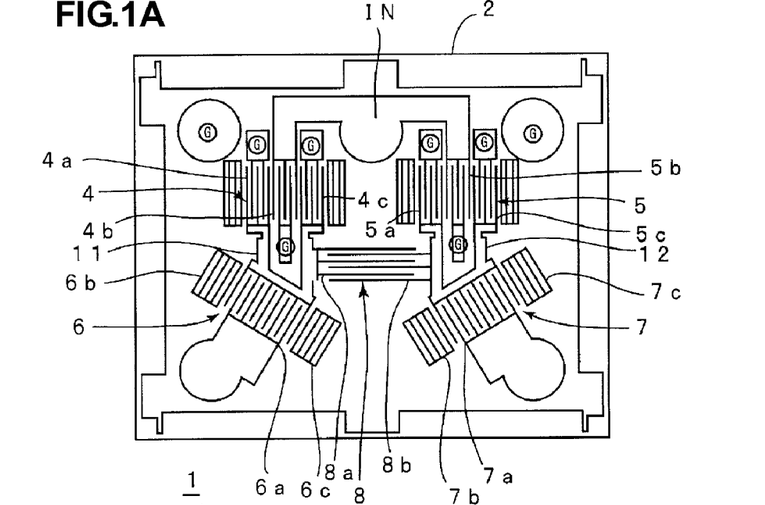
FIGS. 1A and 1B are a schematic plan sectional view and a partial cutout front sectional view of an elastic boundary wave apparatus, respectively, according to a preferred embodiment of the present invention.
Figure 1B:
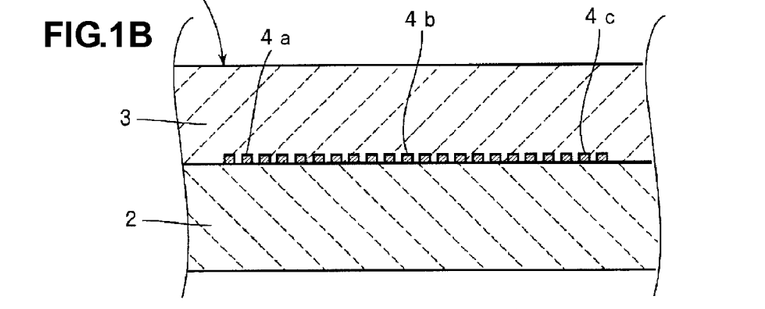

FIGS. 1A and 1B are a plan sectional view and a schematic partial cutout front sectional view of an elastic boundary wave apparatus, respectively, according to a preferred embodiment of the present invention.

An elastic boundary wave apparatus 1 preferably includes a stacked body constructed such that a first medium 2 and a third medium 3 are stacked. In this preferred embodiment, the first medium 2 preferably is made of LiNbO$_3$, and the second medium 3 preferably is made of SiO$_2$.

A plurality of electrodes are disposed at the interface between the first medium 2 and the second medium 3. The plurality of electrodes include longitudinally coupled resonator-type elastic boundary wave filter sections 4 and 5 shown in FIG. 1A, one-port-type elastic boundary wave resonators 6 and 7, and a comb-shaped capacitor electrode 8.

FIG. 1B shows a portion in which the longitudinally coupled resonator-type elastic boundary wave filter section 4 is provided.

In this preferred embodiment, the plurality of electrodes have an electrode layer mainly made of Au. However, in order to increase close contact between the media 2 and 3, a thin NiCr layer is stacked over and under an electrode layer made of Au. This NiCr layer works as a close contact layer.

As shown in FIG. 1A, longitudinally coupled resonator-type elastic boundary wave filter sections 4 and 5 have three IDTs 4a to 4c and three IDTs 5a to 5c arranged in the propagation direction of an elastic boundary wave, respectively. One end of each of IDTs 4b and 5b in the center of the longitudinally coupled resonator-type elastic boundary wave filter sections 4 and 5 is connected to an input end. The IDTs 4a and 4c, and 5a and 5c on both sides are connected to one-port-type elastic boundary wave resonators 6 and 7 serving as a second resonator, respectively.

The elastic boundary wave resonators 6 and 7 have IDTs 6a and 7a, and reflectors 6b, 6c, 7b, and 7c arranged on both sides of the IDTs 6a and 7a, respectively. The longitudinally coupled resonator-type elastic boundary wave filter sections 4 and 5 are connected to output terminals via the elastic boundary wave resonators 6 and 7, respectively.

The longitudinally coupled resonator-type elastic boundary wave filter sections 4 and 5 include a first resonator defined by the IDTs 4a to 4c and 5a to 5c, respectively.

The elastic boundary wave resonators 6 and 7 are connected in series to the longitudinally coupled resonator-type elastic boundary wave filter sections 4 and 5, respectively.

In this preferred embodiment, the longitudinally coupled resonator-type elastic boundary wave filter section 4 and the elastic boundary wave resonator 6 constitute a set of a first filter and a first resonator. The longitudinally coupled resonator-type elastic boundary wave filter section 5 and the one-port-type elastic boundary wave resonator 7 constitute a set of a second filter and a second resonator. These are arranged in parallel to each other.

One of the ends of the first elastic boundary wave filter section 4 and one of the ends of the second elastic boundary wave filter section 5 are connected to each other, thereby defining an input terminal IN.

On the other hand, the elastic boundary wave filter sections 4 and 5 are electrically connected to the elastic boundary wave resonators 6 and 7 via connection electrodes 11 and 12, respectively.

A symbol G circled in FIG. 1A and FIG. 1C (to be described later) denotes that the designated electrode is connected to a ground electrical potential.

The comb-shaped capacitor electrode 8 is connected between the output end of the longitudinally coupled resonator-type elastic boundary wave filter sections 4 and 5 and the ground electrical potential. That is, the comb-shaped capacitor electrode 8 is connected in parallel with the longitudinally coupled resonator-type elastic boundary wave filter sections 4 and 5.

Figure 2:
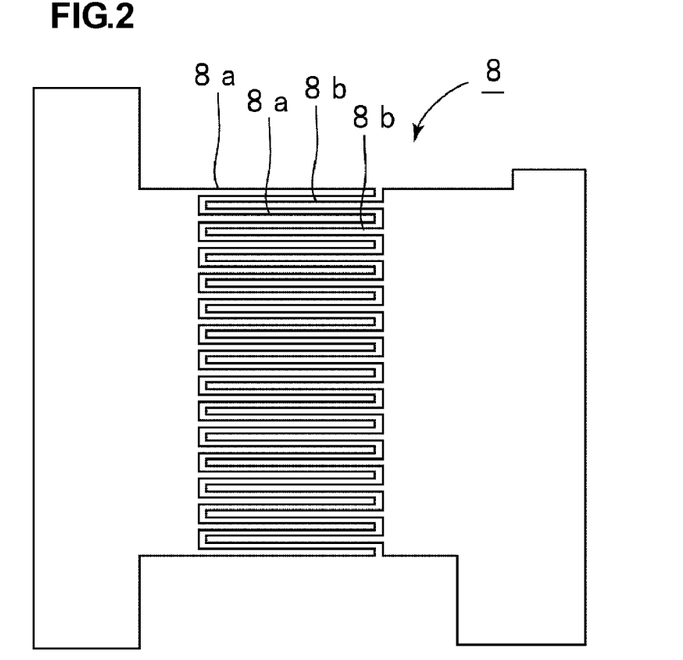
FIG. 2 is a sectional plan view showing an enlarged comb-shaped capacitor electrode of the elastic boundary wave apparatus shown in FIGS. 1A-1C.

The comb-shaped capacitor electrode 8 is shown in such a manner as to be enlarged in the sectional plan view of FIG. 2. The comb-shaped capacitor electrode 8 has a plurality of electrode fingers 8a and 8b that are interdigitated with each other, and preferably has the same construction as those of the IDTs 4a to 4c, 5a to 5c, 6a, and 7a.

The comb-shaped capacitor electrode 8 is provided so that an electrostatic capacitor is connected in parallel with the longitudinally coupled resonator-type elastic boundary wave filter sections 4 and 5. The comb-shaped capacitor electrode 8 can be formed at one time with the IDTs 4a to 4c, 5a to 5c, 6a, and 7a by using the same material, and thereby the cost for connecting the electrostatic capacitor can be reduced.

However, the comb-shaped capacitor electrode 8 may be formed from a material different from those of the IDTs 4a to 4c and 5a to 5c.

In the elastic boundary wave apparatus 1 of this preferred embodiment, the polarity of an electrical signal output from the first longitudinally coupled resonator-type elastic boundary wave filter section 4 is inverted with respect to the polarity of an electrical signal output from the second longitudinally coupled resonator-type elastic boundary wave filter section 5, and one end of the first longitudinally coupled resonator-type elastic boundary wave filter section 4 and one end of the second longitudinally coupled resonator-type elastic boundary wave filter section 5 are commonly connected. Therefore, it is possible to provide a filter apparatus having a balance-to-unbalance conversion function.

In this preferred embodiment, the length direction of the electrode fingers of the comb-shaped capacitor electrode 8 differs from the length direction of the electrode fingers of the IDTs 4a to 4c and 5a to 5c and also differs from the length direction of the electrode fingers of the IDTs 6a and 7a of the elastic boundary wave resonators 6 and 7 serving as second resonators. When the length direction of the electrode fingers of the comb-shaped capacitor electrode 8 differs from the length direction of the electrode fingers of the IDTs 4a to 4c, 5a to 5c, 6a, and 7a, even if an elastic boundary wave is excited by the comb-shaped capacitor electrode, the receiving efficiency of such an elastic boundary wave by the IDTs 4a to 4c, 5a to 5c, 6a, and 7a is decreased. Therefore, the influence of the elastic boundary wave excited by the comb-shaped capacitor electrode 8 can be decreased, which is desirable.

The features of the elastic boundary wave apparatus 1 of this preferred embodiment are as follows. When the period of the IDTs 4a to 4c, 5a to 5c, 6a, and 7a is denoted as λm, the sound velocity of an elastic boundary wave in each IDT is denoted as Vm, the period of the comb-shaped capacitor electrode 8 is denoted as λc, and the sound velocity of a transverse wave of a low sound velocity among the slower transverse waves that propagate through the first medium 2 and the second medium 3 in the normal direction of the electrode fingers in the comb-shaped capacitor electrode 8 is denoted as Vc, a relationship Vm/λm<Vc/λc is satisfied. As a result, with the provision of the comb-shaped capacitor electrode 8, satisfactory filter characteristics in which a spurious influence is not easily received can be realized.

Since the comb-shaped capacitor electrode 8 is provided between the first medium 2 and the second medium 3, the comb-shaped capacitor electrode 8 can be formed at one time with the IDTs 4a to 4c or the like by using the same material in the manner described above. Moreover, since the relative dielectric constant of LiNbO$_3$ is 44 and is comparatively large, it is possible to obtain a sufficiently large electrostatic capacitor using a small comb-shaped capacitor electrode 8.

However, as described above, when the comb-shaped capacitor electrode 8 is arranged so as to contact LiNbO$_3$ that is a piezoelectric body, an electrical potential is applied to electrode fingers that are connected to different electrical potentials of the comb-shaped capacitor electrode 8. As a result, the comb-shaped capacitor electrode 8 works as an IDT in the same manner as the IDTs 4a to 4c, and an elastic boundary wave is excited. The elastic boundary wave excited by the comb-shaped capacitor electrode 8 appears as a spurious response in the original frequency characteristics used for the filter.

Figure 7A:
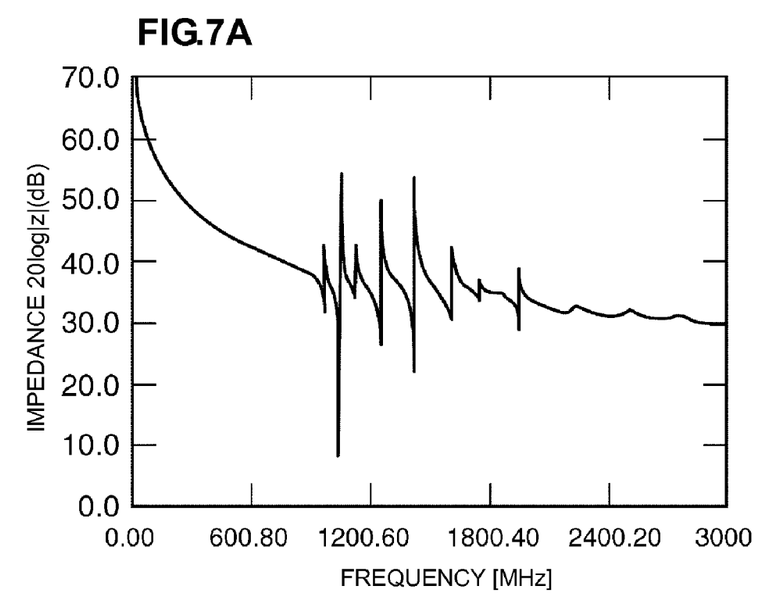
FIGS. 7A and 7B show impedance characteristics and phase characteristics of a comb-shaped capacitor electrode used for the elastic boundary wave apparatus shown in FIGS. 1A-1C when $\psi$ is set at $90°$.
Figure 7B:
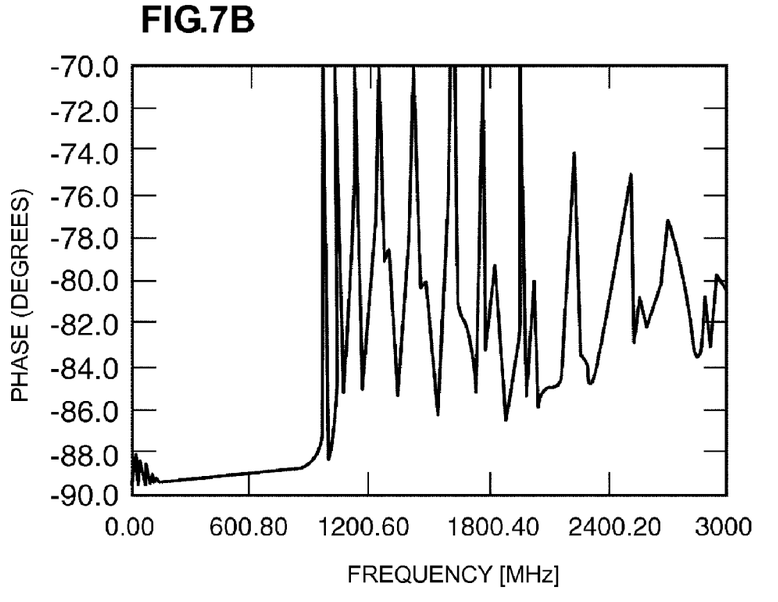

FIGS. 7A and 7B show impedance characteristics and phase characteristics of the comb-shaped capacitor electrode 8 in which $\psi=90°$, respectively.

In this specification, the comb-shaped capacitor electrode in which $\psi=90°$ is based on an Euler angle representation in an elastic boundary wave apparatus using a LiNbO$_3$ substrate. In the Euler angle representation, when the crystal orientation axes of LiNbO$_3$ are defined as X, Y, and Z, the axis in which the X axis is rotated in an amount corresponding to $\phi$ toward the Y axis with the Z axis being the center axis is denoted as A1, and the axis in which the Z axis is rotated in an amount corresponding to $\theta$ in a counterclock direction with the A1 axis being the center axis is denoted as A2. In a substrate having a plane including the A1 axis and having the A2 axis as the normal line, the direction in which the A1 axis is rotated in an amount corresponding to $\psi$ in a counterclockwise direction with the A2 axis being the center axis is defined as the propagation direction of the wave. Therefore, the comb-shaped capacitor electrode in which $\psi=90°$ refers to a comb-shaped capacitor electrode in which the angle of the normal direction of the electrode fingers is 90° with respect to the A1 axis. Also, in the following, similarly, an elastic boundary wave resonator in which $\psi=0°$ refers to an elastic boundary wave resonator in which the angle of the normal direction of the electrode fingers of an IDT of the elastic boundary wave resonator is 0° with respect to the A1 axis.

As is clear from FIGS. 7A and 7B, the period of the IDTs of the comb-shaped capacitor electrode 8 is preferably set at about 3.4 μm in this preferred embodiment. The comb-shaped capacitor electrode 8 works as a capacitor element at a frequency band in which the phase becomes in the vicinity of −90°.

Figure 8A:
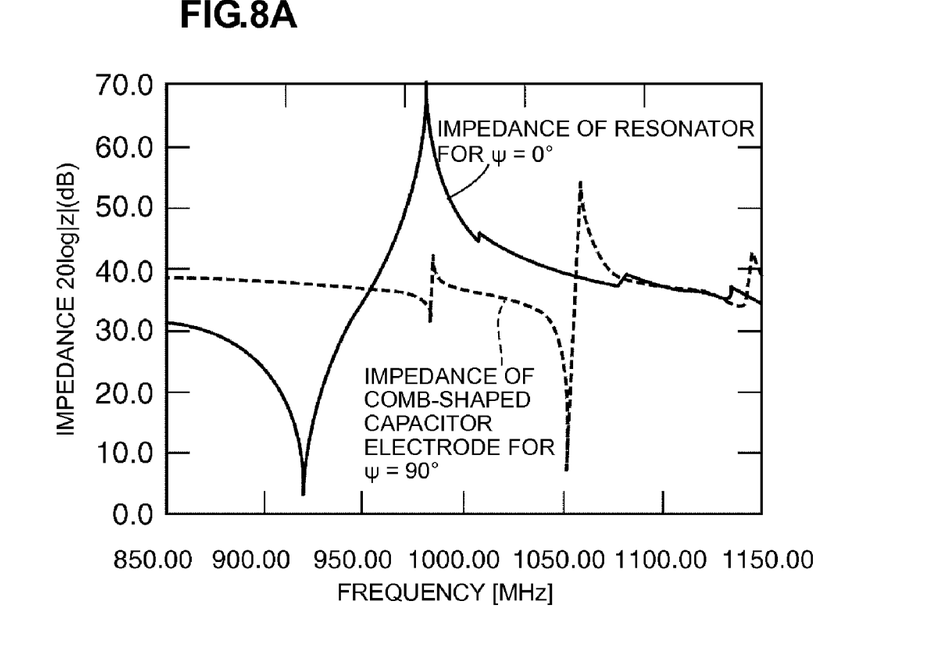
FIGS. 8A and 8B show impedance characteristics and phase characteristics in the vicinity of a main mode of the elastic boundary wave apparatus shown in FIGS. 1A-1C.
Figure 8B:
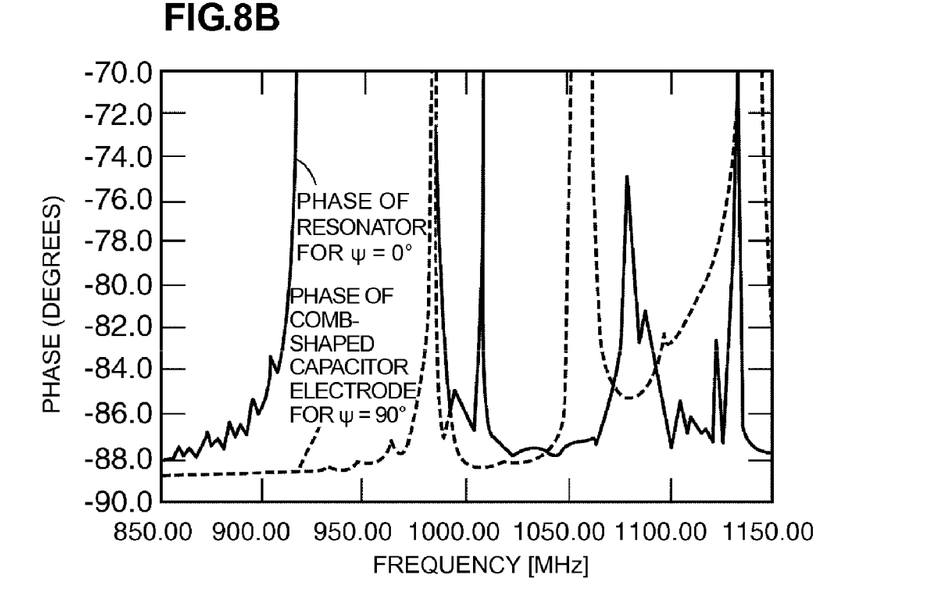

FIGS. 8A and 8B show impedance characteristics and phase characteristics of an elastic boundary wave resonator in which $\psi=0°$, respectively. As is clear from FIGS. 8A and 8B, conditions in which the phase is in the vicinity of −90° are the portions that satisfy the following conditions (1) to (3):

(1) The frequency band in which the frequency F× the period $\lambda c$ of the comb-shaped capacitor electrode 8 is lower than or equal to the sound velocity of a slower transverse wave that propagates through at least one of the media 2 and 3;

(2) The frequency band of other than the response of the basic mode of an SH-type elastic boundary wave; and (3) The frequency band of other than the response of the basic mode of a P+SV type elastic boundary wave.

As shown in FIGS. 7A and 7B and FIGS. 8A and 8B, when the lower sound velocity among the sound velocities of the slower transverse waves that propagate through at least one of the media 2 and 3 is denoted as Vc, Vc/$\lambda c$ is often comparatively close to the basic mode response frequency of the SH-type elastic boundary wave and the response frequency of the basic mode of the P+SV type elastic boundary wave. Therefore, for example, when $\psi$ of the comb-shaped capacitor electrode 8 and that of the elastic boundary wave filter sections 4 and 5 are the same, that is, for example, when the length direction of the electrode fingers of the IDTs 4a to 4c and 5a to 5c is the same as the length direction of the electrode fingers of the comb-shaped capacitor electrode 8, the electrode finger period $\lambda c$ of the comb-shaped capacitor electrode 8 connected to the elastic boundary wave filter is set to be shorter than the period $\lambda m$ of the IDTs of the filter, and the electrode finger width of the electrode fingers becomes narrow, which is undesirable.

On the other hand, by using the comb-shaped capacitor electrode 8 having $\psi$ differing from those of the IDTs 4a to 4c and 5a to 5c of the longitudinally coupled resonator-type elastic boundary wave filter sections 4 and 5, when a higher sound velocity is achieved, the period $\lambda c$ of the comb-shaped capacitor electrode 8 can be set to be longer in an amount corresponding to the sound velocity ratio.

The period $\lambda c$ of the comb-shaped capacitor electrode 8 can be set longer by an amount equivalent to the ratio of the sound velocity of the main mode in the longitudinally coupled resonator-type elastic boundary wave filter sections 4 and 5 of the comb-shaped capacitor electrode 8 of $\psi$, at which the elastic boundary wave in the same mode as those of the longitudinally coupled resonator-type elastic boundary wave filter sections 4 and 5 is not excited in the comb-shaped capacitor electrode 8, and another mode of a high sound velocity is strongly excited, to the sound velocity of another mode excited by the comb-shaped capacitor electrode 8.

Figure 3:
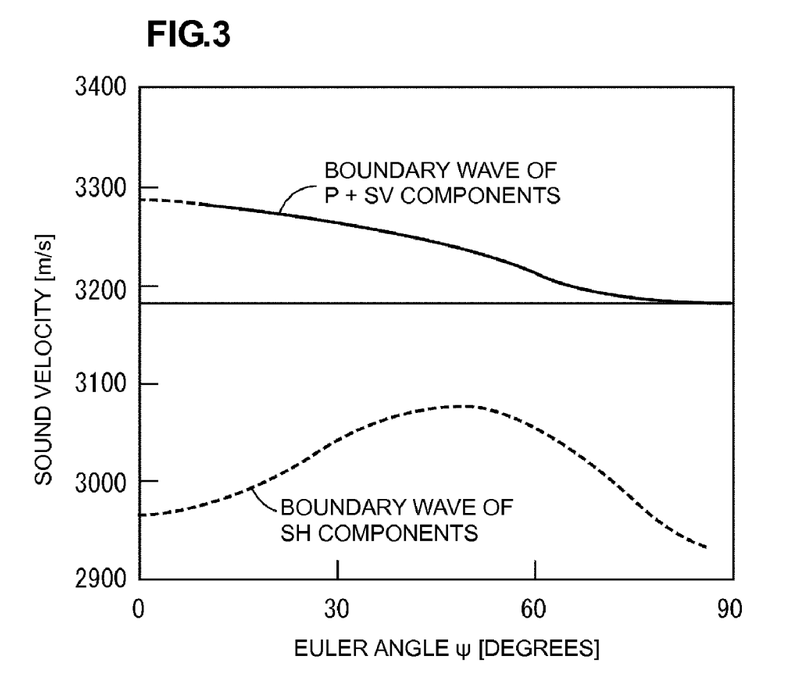
FIG. 3 shows the relationship between the Euler angle $\psi$ of $LiNbO_3$ and the sound velocity of an elastic boundary wave.
Figure 4:
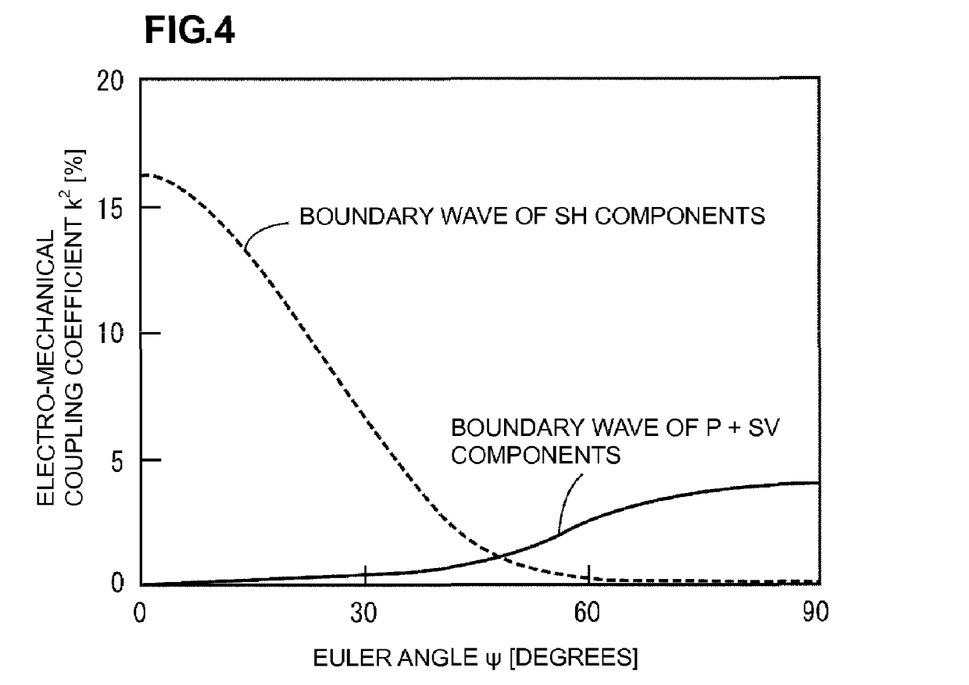
FIG. 4 shows the relationship between the Euler angle $\psi$ of $LiNbO_3$ and an electromechanical coupling coefficient $K^2$ of an elastic boundary wave.
Figure 5:
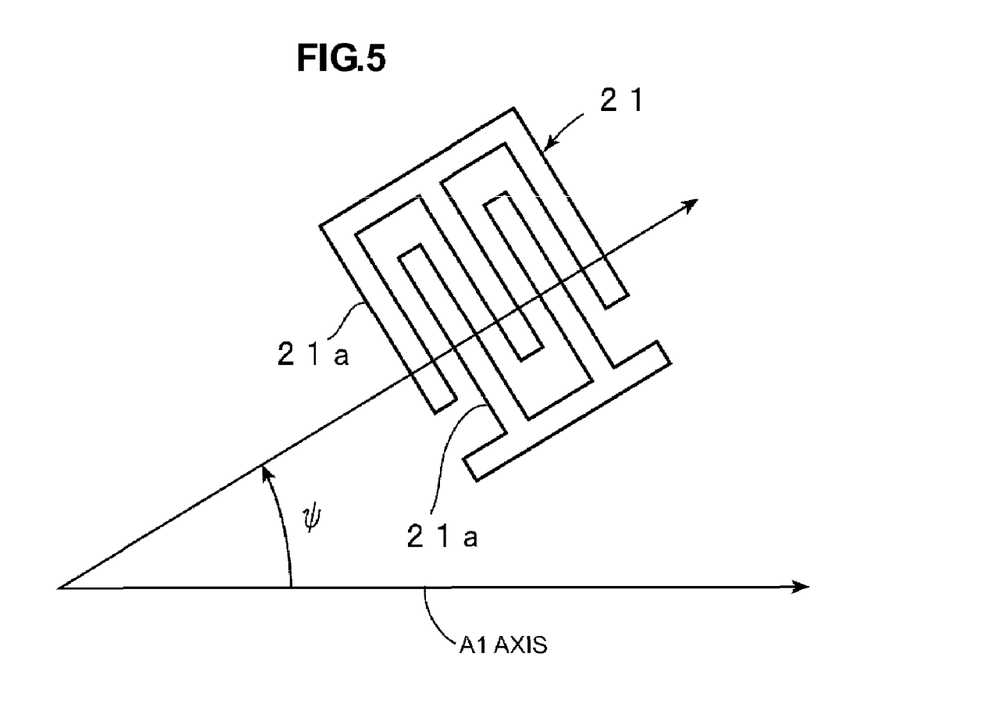
FIG. 5 is a sectional plan view illustrating an angle $\psi$ of the normal direction of electrode fingers of an IDT with respect to the A1 axis of $LiNbO_3$.
Figure 6A:
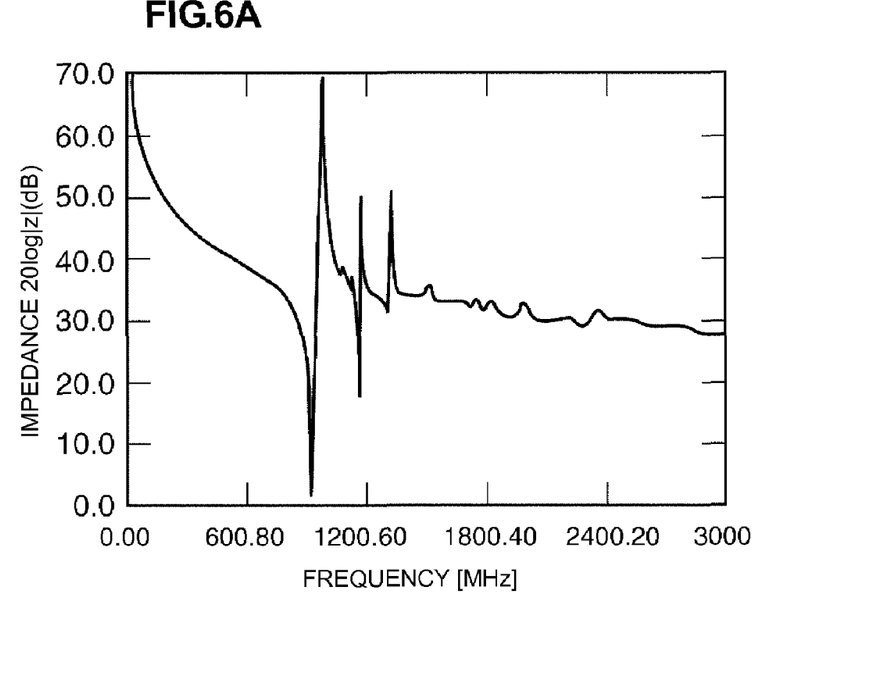
FIGS. 6A and 6B show impedance characteristics and phase characteristics of an elastic boundary wave resonator of the elastic boundary wave apparatus shown in FIGS. 1A-1C when the second resonator is set at $\psi=0°$.
Figure 6B:
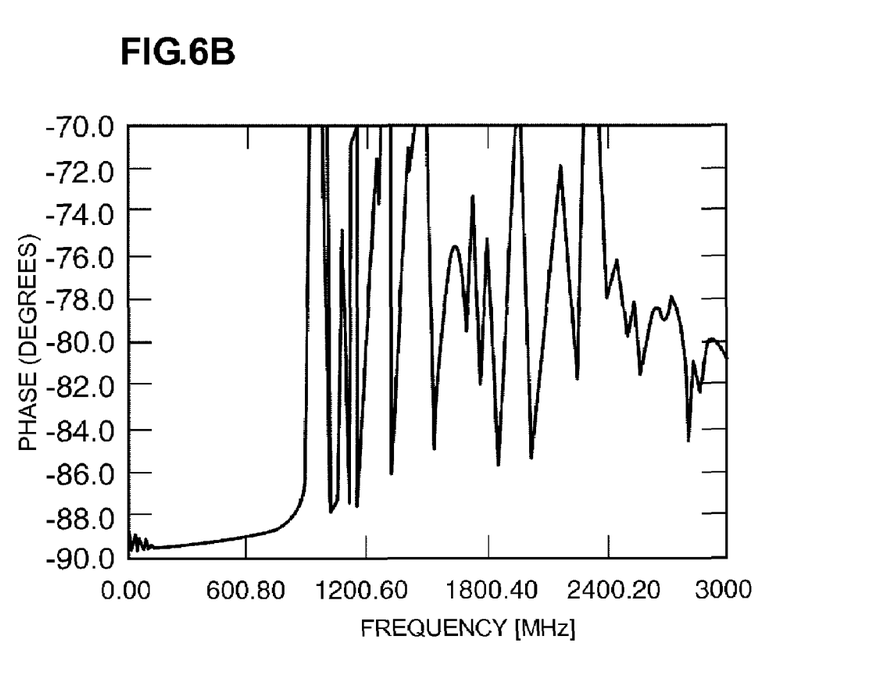

FIGS. 3 and 4 show the relationship among the propagation angle $\psi$ of an IDT, the sound velocity of an elastic boundary wave, and an electromechanical coupling coefficient $K^2$. As shown in FIG. 5, when an IDT 21 is used as an example, the propagation angle $\psi$ is assumed to refer to an angle formed between the line normal to a plurality of electrode fingers 21a and the A1 axis of LiNbO$_3$.

FIGS. 3 and 4 show results determined on the basis of calculations when a plurality of electrodes in the elastic boundary wave apparatus 1 is made of Au, their thickness is set at about 0.05$\lambda$, a medium 1 is LiNbO$_3$ of 15° Y-cut X-propagation ((0°, 105°, and $\psi$) in an Euler angle), its thickness is set at infinity, and the thickness of SiO$_2$ is set at infinity.

As is clear from FIGS. 3 and 4, the electromechanical coupling coefficient $K^2$ of the SH-type elastic boundary wave is large at $\psi=0°$, and the sound velocity was about 2960 m/second. It is seen that the electromechanical coupling coefficient $K^2$ of the P+SV type elastic boundary wave is approximately 0.

On the other hand, at $\psi=90°$, the electromechanical coupling coefficient $K^2$ of the SH-type elastic boundary wave is approximately 0, the electromechanical coupling coefficient $K^2$ of the P+SV type elastic boundary wave is slightly small to be approximately 5%, and the sound velocity was about 3180 m/second.

Whereas the electromechanical coupling coefficient $K^2$ of the SH-type boundary wave is sufficiently small, the electromechanical coupling coefficient $K^2$ of the P+SV type boundary wave is slightly large. Consequently, a spurious response due to the P+SV type boundary wave occurs. However, since the sound velocity of the P+SV type boundary wave is higher by about 7.4% than the sound velocity of the SH-type boundary wave of the comb-shaped capacitor electrode in which $\psi=0°$, the spurious response frequency becomes higher by about 7.4%. Therefore, by only making the electrode finger period $\lambda c$ of the comb-shaped capacitor electrode 8 to be slightly smaller, the spurious response of the P+SV type boundary wave with respect to the main response by the SH-type boundary wave in which $\psi=0°$ is shifted toward high frequencies and is omitted.

The degree at which the electrode finger period $\lambda c$ of the comb-shaped capacitor electrode 8 is slightly decreased is preferably in the range of $\lambda c>0.5\times\lambda m$. When $\lambda c$ is within this range, a spurious response is reduced while the electrode fingers of IDT electrodes and comb-shaped capacitor electrodes are manufactured with high accuracy. This point will be described below.

In the relationship between the period $\lambda c$ of the electrode fingers of the comb-shaped capacitor electrode and the period $\lambda m$ of the electrode fingers of the comb-shaped capacitor electrode, in the case that there are comb-shaped electrodes having large different line & space in one elastic boundary wave apparatus, in case the same line width accuracy is to be obtained, the focus depth becomes insufficient in the small line width in an exposure in a photolithography step, and manufacturing becomes impossible. In general, when line & space differ twice, manufacturing becomes difficult. As a result of the above, by setting $\lambda c>0.5\times\lambda m$, line & space in one elastic boundary wave apparatus are within two times, and manufacturing becomes possible. Therefore, filter characteristics or resonance characteristics are improved.

Figure 9A:
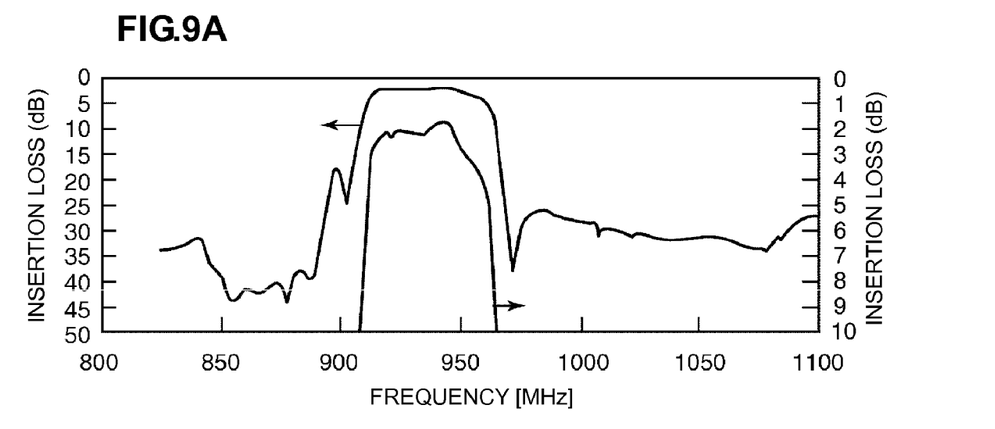
FIGS. 9A and 9B show filter characteristics of an elastic boundary wave apparatus according to a preferred embodiment of the present invention.
Figure 9B:
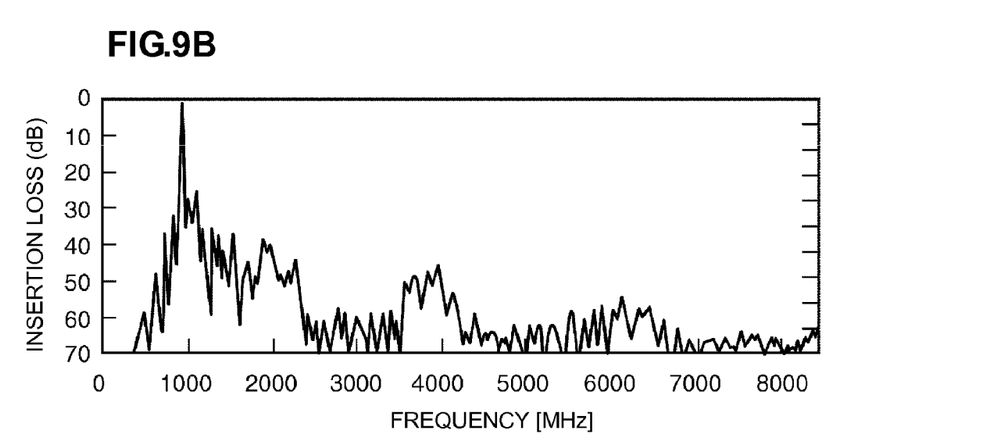

Filter characteristics of the elastic boundary wave apparatus 1 of this preferred embodiment are shown in FIGS. 9A and 9B. The above-described filter characteristics are characteristics when the elastic boundary wave apparatus 1 is manufactured under the following conditions.

For the first medium, LiNbO$_3$ having a thickness of about 370 nm was used, and the Euler angle was [0°, 105°, and $\psi$], where $\psi=0°$ in the filter section, $\psi=30°$ in the resonator section, and $\psi=90°$ in the comb-shaped capacitor electrode section. For the second medium, SiO$_2$ having a thickness of about 6 μm was used. The IDT is configured such that NiCr/Au/NiCr are stacked at a thickness of approximately 10/150/10 nm.

Figure 1C:
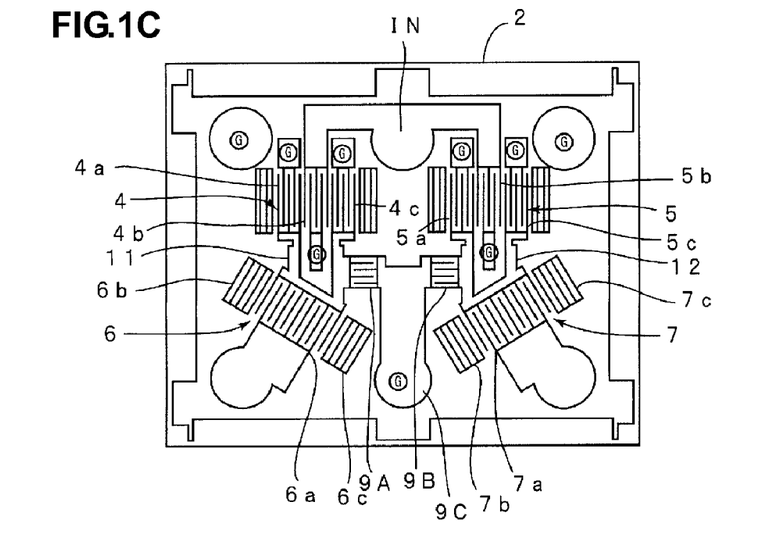
FIG. 1C is a schematic plan sectional view of the elastic boundary wave apparatus according to a modification of this preferred embodiment.

In the above-described preferred embodiment, the comb-shaped capacitor electrode 8 is provided, and the comb-shaped capacitor electrode 8 may be divided into two portions so that a first comb-shaped capacitor electrode 9A and a second comb-shaped capacitor electrode 9B are provided as in a modification shown in FIG. 1C. In this modification, the comb-shaped capacitor electrode 9A is connected such that an electrostatic capacitor is added in parallel to a set of the elastic boundary wave filter section 4 and the one-port-type elastic boundary wave resonator 6. Furthermore, the comb-shaped capacitor electrode 9B is connected such that an electrostatic capacitor is added to a set of the elastic boundary wave filter section 5 and the one-port-type elastic boundary wave resonator 7.

One end of the comb-shaped capacitor electrode 9A and one end of the comb-shaped capacitor electrode 9B are commonly connected and are electrically connected to a terminal electrode 9C connected to the ground electrical potential. Here, one end of the comb-shaped capacitor electrode 9A and one end of the comb-shaped capacitor electrode 9B are arranged on the first set side and on the second set side, respectively, and each of patterns is arranged on the side where the comb-shaped capacitor electrodes 9A and 9B oppose each other. In the portion where the comb-shaped capacitor electrodes 9A and 9B oppose each other, that is, at the midpoint of them, the terminal electrode 9C is electrically connected to the comb-shaped capacitor electrodes 9A and 9B. Consequently, by forming such comb-shaped capacitor electrodes 9A and 9B and terminal electrode 9C, the degree of balance can be improved further.

In the above-described preferred embodiment, the first medium is formed by LiNbO$_3$ of (0°, 105° C., $\psi$). Alternatively, it may be formed by LiNbO$_3$ of another crystal orientation or may be formed by a piezoelectric body, such as a piezoelectric single crystal such as LiTaO$_3$.

The second medium may be formed by a non-conductive material other than SiO$_2$, that is, various insulating materials or dielectric materials. Furthermore, a third medium may also be stacked on the second medium.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An elastic boundary wave apparatus comprising:
   a first medium;
   a second medium stacked on the first medium; and
   a plurality of electrodes arranged in a boundary between the first and second media; wherein
   a filter and/or a resonator, and an electrostatic capacitor that is electrically connected to the filter and/or the resonator are defined by the plurality of electrodes;
   the filter and/or the resonator each include an IDT electrode;
   the electrostatic capacitor includes a comb-shaped capacitor electrode; and
   when a period of the electrode fingers of the IDT is denoted as $\lambda m$, a sound velocity of an elastic boundary wave in the IDT is denoted as Vm, a period of electrode fingers of the comb-shaped capacitor electrode is denoted as $\lambda c$, and a sound velocity of a transverse wave having a lower sound velocity among the lower sound velocities of transverse waves through the first and second media in the normal direction of the electrode fingers of the comb-shaped capacitor electrode is denoted as Vc, a relationship Vm/$\lambda m$<Vc/$\lambda c$ is satisfied.

2. The elastic boundary wave apparatus according to claim 1, wherein a relationship $\lambda c>0.5\times\lambda m$ is satisfied.

3. The elastic boundary wave apparatus according to claim 1, wherein the filter and the resonator are each defined by the plurality of electrodes, the terminals of the filter and the resonator are connected in series to each other, and the comb-shaped capacitor electrodes are connected in parallel to the electrodes that connect the filter to the resonator.

4. The elastic boundary wave apparatus according to claim 3, wherein, as the filter and the resonator, one pair of a set of a first filter having first and second terminals and a first resonator, and a set of a second filter having first and second terminals and a second resonator are arranged in parallel, the first terminal of the first filter and the first terminal of the second filter are connected to each other defining an input terminal, the polarity of an electrical signal output from the second terminal of the first filter is inverted with respect to the polarity of an electrical signal output from the second terminal of the second filter, the elastic boundary wave apparatus further including:
   a first connection electrode that connects the second terminal of the first filter in series to the first resonator; and
   a second connection electrode that connects the second terminal of the second filter in series to the second resonator; wherein
   the first connection electrode and the second connection electrode are connected in parallel to each other via the comb-shaped capacitor electrode.

5. The elastic boundary wave apparatus according to claim 4, wherein the comb-shaped capacitor electrode includes first and second comb-shaped capacitor electrodes, one end of the first comb-shaped capacitor electrode and one end of the second comb-shaped capacitor electrode are commonly connected and are also grounded.

6. The elastic boundary wave apparatus according to claim 4, wherein the sound velocity of an elastic boundary wave propagation mode in which a main response of the comb-shaped capacitor electrode is located is higher than the sound velocity of the propagation mode of an elastic boundary wave in the IDT constituting the first resonator and the second resonator.

7. The elastic boundary wave apparatus according to claim 4, wherein a length direction of the electrode fingers of the comb-shaped capacitor electrode differs from a length direction of the electrode fingers of the IDT constituting the first resonator and the second resonator.

* * * * *